(12) United States Patent
Yoneyama et al.

(10) Patent No.: US 8,432,612 B2
(45) Date of Patent: Apr. 30, 2013

(54) WAFER LENS UNIT AND METHOD FOR MANUFACTURING THE SAME

(75) Inventors: Satoshi Yoneyama, Kanagawa (JP); Ryo Matsuno, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 42 days.

(21) Appl. No.: 13/045,189

(22) Filed: Mar. 10, 2011

(65) Prior Publication Data

US 2011/0222161 A1    Sep. 15, 2011

(30) Foreign Application Priority Data

Mar. 10, 2010 (JP) ................................. 2010-053124

(51) Int. Cl.
G02B 27/10 (2006.01)
G03B 21/60 (2006.01)

(52) U.S. Cl.
USPC ............................ 359/619; 359/454; 359/621

(58) Field of Classification Search .......... 359/628–621, 359/625–626, 443, 454–455; 264/1.1, 1.32, 264/2.7
See application file for complete search history.

(56) References Cited

U.S. PATENT DOCUMENTS

| | | | | |
|---|---|---|---|---|
| 6,324,010 | B1 * | 11/2001 | Bowen et al. ................. | 359/622 |
| 7,903,355 | B2 * | 3/2011 | Abe et al. ...................... | 359/819 |
| 2004/0008417 | A1 | 1/2004 | Shimizu et al. | |
| 2005/0128580 | A1 * | 6/2005 | Olofson et al. ............... | 359/443 |
| 2006/0044450 | A1 | 3/2006 | Wolterink et al. | |
| 2007/0195262 | A1 * | 8/2007 | Mosse et al. .................. | 351/159 |
| 2007/0267647 | A1 | 11/2007 | Lee et al. | |
| 2007/0275505 | A1 | 11/2007 | Wolterink et al. | |
| 2008/0136434 | A1 | 6/2008 | Lu et al. | |
| 2009/0050946 | A1 * | 2/2009 | Duparre et al. ............... | 257/294 |
| 2009/0284837 | A1 | 11/2009 | Lake et al. | |
| 2012/0068370 | A1 * | 3/2012 | Saruya et al. ................ | 264/1.36 |

FOREIGN PATENT DOCUMENTS

| | | |
|---|---|---|
| JP | 07-248404 | 9/1995 |
| JP | 2003-294912 | 10/2003 |
| JP | 2005-539276 | 12/2005 |
| WO | WO2004/027880 | 4/2004 |
| WO | WO2007/107025 | 9/2007 |
| WO | WO2008/084646 | 7/2008 |

OTHER PUBLICATIONS

Extended European Search Report issued May 11, 2011; Application No: 11157449.7.

* cited by examiner

*Primary Examiner* — Dawayne A Pinkney

(74) *Attorney, Agent, or Firm* — Young & Thompson

(57) ABSTRACT

Provided is a wafer lens unit comprising a plurality of wafer lens arrays, wherein the wafer lens array comprises a plurality of lenses arranged in one dimension or two dimensions and a substrate interconnecting the lenses; and the neighboring wafer lens arrays are bonded through an adhesive layer comprising a spacer only at the substrates thereof.

20 Claims, 1 Drawing Sheet

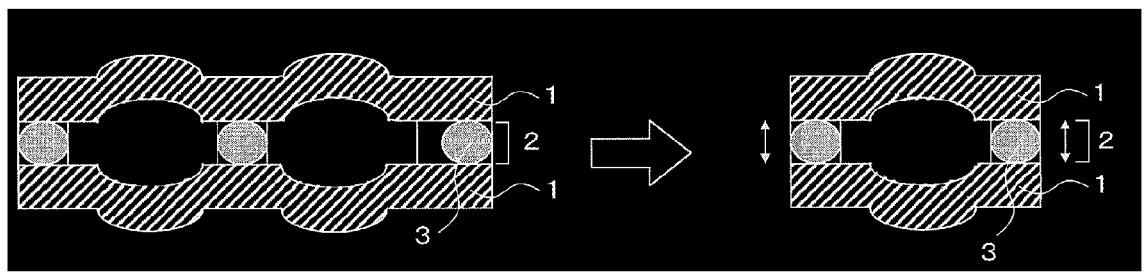

WAFER LENS UNIT AND METHOD FOR MANUFACTURING THE SAME

CROSS-REFERENCE TO RELATED APPLICATIONS

The present application claims the benefit of priority from Japanese Patent Application No. 053124/2010, filed on Mar. 10, 2010, the contents of which are herein incorporated by reference in their entirety.

BACKGROUND OF THE INVENTION

1. Field of the Invention

The invention relates to a wafer lens unit and a method for manufacturing the wafer lens unit.

2. Description of the Related Art

Currently, portable terminals of electronic device such as mobile phone and PDAs (Personal Digital Assistant) are equipped with image pickup units which have small and thin shapes.

Such image pickup units generally include a solid-state image pickup device such as a CCD (Charge Coupled Device) image sensor ora CMOS (Complementarray Metal-Oxide Semiconductor) image sensor, and lenses that form an image on the solid-state image pickup device. As mobile terminals become smaller and thinner, the image pickup units mounted on those are also required to achieve reduction in size and thickness. In order to decrease the cost of the portable terminals, improvement of productivity is desired. As a method for manufacturing such small lenses in large numbers, known is a method for lenses module comprising producing a wafer lens array comprising a substrate section and a plurality of lenses on the substrate section, cutting the substrate section to form pieces comprising a lens. By the method, lens modules can be mass-produced. Also known is a method for mass-manufacturing an image pickup unit comprising integrally combining a substrate section in which a plurality of lens sections are formed and a sensor substrate in which a plurality of solid-state imaging pickup device was form formed and cutting the sensor substrate with the substrate so that the unit comprises a lens and a solid-state imaging pickup device.

Heretofore, as the references concerning the wafer lens, knows are JP-T-2005-539276, WO07/107025, JP-A-H7-248404, and JP-A-2003-294912. JP-T-2005-539276 discloses a multilayer-structure comprising stacked wafer lenses which comprise a substrate and a plurality of lenses on the substrate. WO07/107025 discloses a method comprising feeding formation material on a substrate to form a lens on the substrate using a mold. As is different from the above wafer lens, a known article comprising a plurality of lenses is a micro lens array which does not integrally connect with the substrate. JP-A-H7-248404 does not use a mold for forming lenses since a resin layer which is formed on one side of a substrate is pressed and cured with a substrate comprising holes. JP-A-2003-294912 discloses a technique for forming a micro lens array comprising a two-layer structure, wherein the axes of the two layers adjusted to correspond to each other.

SUMMARY OF THE INVENTION

In the case of manufacturing a wafer lens unit comprising two or three wafer lens arrays such as used in mobile phones, a wafer lens array needs to adhere to a wafer lens array so as to have a suitable gap therebetween. This is because variation of the gap at the time of stacking the wafer lens arrays causes serious problems in optical properties as a lens unit. For example, when there is increase or decrease of 5 μm in gap, relative to the designed value, the eccentricity of the lens greatly deteriorates. In addition, when the gap in outer circumference of the lens increases the distribution, the lens declines to degrade the eccentricity thereof.

JP-T-2005-539276 adjusts the gap by forming a spacer between the adhesive layers. The method, however, requires such a superfluous process in addition to the general process.

The wafer lens arrays are preferably stuck by applying the adhesive on the whole surface thereof because the lenses become stable and the gap of the lenses can be easily adjusted. However, there may be a problem in the performance of the lenses when the adhesive is present on the lenses. That is, it is required that the wafer lens arrays are stuck by applying the adhesive only on the substrate thereof in the condition that the gap is desirably adjusted with great precision.

An object of the invention is to meet the needs, and to provide a method for stacking a plurality of wafer lens arrays in a desired gap, and a wafer lens unit obtainable by the method.

Under the above problems, the inventors investigated to disperse a spacer in the adhesive layer and adjust the gap by the adhesive layer itself. It was found that the method can adjust the gap between the neighboring lenses with great precision, and therefore, can provide a wafer lens module having sufficiently great performance even if an adhesive layer is provided only on the substrate. Specifically, the object of the invention has been achieved by the following means.

[1] A wafer lens unit comprising a plurality of wafer lens arrays which are stacked, wherein the wafer lens array comprises a plurality of lens sections arranged one-dimensionally or two-dimensionally and a substrate section connecting the lens sections to each other; and the neighboring wafer lens arrays are bonded through an adhesive layer comprising a spacer only at the substrate sections thereof.

[2] The wafer lens unit according to [1], wherein the spacer is a spherical particle.

[3] The wafer lens unit according to [1] or [2], wherein the adhesive layer shades at least one of ultraviolet ray, visible ray and infrared ray.

[4] The wafer lens unit according to any on of [1] to [3], wherein the adhesive layer is formed by pattering.

[5] The wafer lens unit according to [4], wherein the adhesive layer is formed by inkjet-printing or screen-printing.

[6] The wafer lens unit according to any one of [1] to [5], wherein the adhesive layer is an adhesive sheet having a shape corresponding to the substrate.

[7] The wafer lens unit according to any one of [1] to [6], wherein the material of the wafer lens array and the material constituting the adhesive layer are common to each other by 70% by weight or more.

[8] The wafer lens unit according to any one of [1] to [7], wherein the lens sections are composed of the same composition as the substrate section in at least one of the wafer lens arrays.

[9] The wafer lens unit according to any one of [1] to [8], wherein the spacer is a spherical particle having a particle size of 50 μm or less.

[10] The wafer lens unit according to any one of [1] to [9], wherein the spacer comprises silica.

[11] The wafer lens unit according to any one of [1] to [10], wherein the spacer shades at least one of ultraviolet light, visible light and infrared light.

[12] The wafer lens unit according to any one of [1] to [11], wherein the spacer has a moisture absorbability of 1% or less.

[13] The wafer lens unit according to any one of [1] to [12], wherein the wafer lens arrays is mainly composed of a curable resin having a glass-transition temperature of 200° C. or higher.

[14] The wafer lens unit according to any one of [1] to [13], wherein the difference between the Abbe number of the resin composing the substrate section and the Abbe number of the resin composing the lens sections is 5 or less.

[15] The wafer lens unit according to any one of [1] to [14], which comprises two or three wafer lens arrays.

[16] A lens module obtained by dicing the wafer lens unit according to any one of [1] to [15] into pieces.

[17] An image pickup unit comprising the lens module according to [16], a semiconductor substrate and an image pickup device provided on the semiconductor substrate, wherein the substrate and the semiconductor substrate are bonded through a spacer.

[18] A method for manufacturing a wafer lens unit, which comprises bonding two wafer lens arrays to each other through an adhesive layer comprising a spacer; and wherein the wafer lens array comprises a plurality of lens sections arranged one-dimensionally or two-dimensionally and a substrate section connecting the lens sections to each other.

[19] The method for manufacturing a wafer lens unit according to [18], wherein the spacer is a spherical particle.

[20] The method for manufacturing a wafer lens unit according to [18] or [19], wherein the wafer lens arrays are bonded to each other under vacuum.

The invention can control the gap between the neighboring wafer lens arrays with great precision by providing an adhesive layer only on the substrate.

BRIEF DESCRIPTION OF THE DRAWINGS

FIG. 1 is a schematic view showing a step of forming sticking the wafer lens arrays to each other to form a wafer lens unit in the invention, wherein 1 stands for a wafer lens array, 2 stands for an adhesive layer and 3 stands for a spacer.

BEST MODE FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

The wafer lens unit comprising a wafer lens array which are stacked to each other, wherein the wafer lens array comprises a plurality of lens sections arranged one-dimensionally or two-dimensionally and a substrate section connecting the lens sections; and the neighboring wafer lens arrays are bonded to each other through an adhesive layer comprising a spacer only at the substrate section thereof. By employing the adhesive layer comprising a spacer and by bonding only the surfaces of the respective substrate sections thereof to each other, the gap between the neighboring wafer lens arrays can be suitably controlled, and therefore, the invention makes it possible to stick the wafer lens arrays without influencing the optical properties of the lens sections. In addition, such a bonding of the respective surfaces of the substrate sections prevents dust or the like from penetrating into the lenses, and therefore, makes it possible to improve the optical properties of the lens sections. Although the invention is characterized in that the neighboring wafer lens arrays are bonded only at the substrate sections to each other thereof through an adhesive layer comprising a spacer, all of the wafer lens arrays may bond to the respective neighboring wafer arrays only at the substrate sections thereof through the adhesive layer. Hereinunder, the invention is described in detail.

Wafer Lens Array

The wafer lens array for use in the invention comprises a plurality of lens sections arranged one-dimensionally or two-dimensionally and a substrate section connecting the lens sections. The lens sections in the wafer lens array are composed of a curable resin having an optical property substantively coequal to a curable resin of which the substrate section is composed of. And the lens sections and the substrate in the wafer lens array are integrally formed. The shape of the lens section is not specifically limited and may be changed in accordance with the use thereof. The curable resin having a substantively coequal optical property is meant that, when the resin composing the substrate section and the resin composing the lens section each are cured, the optical properties will be substantively coequal to each other. The substantively coequal optical property is meant that difference between refractive indexes thereof is 0.01 or less and difference between the Abbe numbers of the resins is 5 or less. The difference between refractive indexes thereof is preferably 0.005 or less, more preferably 0.003 or less. The difference between the Abbe numbers thereof is preferably 2 or less, preferably 1 or less, further more preferably 0.

The plurality of wafer lens arrays as bonded in the invention each preferably have a different optical property to each other and a different shape to each other. Particularly preferably, the wafer lens arrays bonded to each other include at least two kinds of wafer lens array of which one has high Abbe number and another has low Abbe number. The high Abbe number that the wafer lens array may have is preferably 50 or more, more preferably 55 or more, further more preferably 60 or more. The refraction index that the wafer lens array may have is preferably 1.52 or more, more preferably 1.55 or more, further more preferably 1.57 or more. The low Abbe number that the wafer lens array may have is preferably 30 or less, more preferably 25 or less, further more preferably 20. The refractive index that the wafer lens array may have is preferably 1.60 or more, more preferably 1.63 or more, further more preferably 1.65 or more. The number of the wafer lens array is preferably 2 or 3.

The shape of the lenses is suitably designed in accordance with their optical properties. The lens comprises desired lens surfaces formed on the lens section. The shape of the lens surfaces on the two sides of the wafer lens array may be the same or different to each other. The lens surfaces are not limited to the convex spherical surfaces, and may be concave spherical surfaces, aspheric surfaces, or various combinations of the convex spherical surface, the concave spherical surface, and the aspheric surface.

Adhesive Layer

In the invention, the wafer lens arrays are bonded through the adhesive layer. The material composing the adhesive layer is not specifically limited without diverting the scope of the invention, and may be a liquid type or a sheet type. Material composing the adhesive layer preferably has a high adhesion property to the material composing the wafer lens array. More preferably, the main component composing the adhesive layer is the same material of the main component composing the wafer lens allay. Further more preferably, the material of the wafer lens array and the material constituting the adhesive layer are common to each other by 70% by weight or more, even more preferably 90% by weight or more. Such a composition improves the adhesiveness between the substrate sections and prevents the adhesive layer from peeling and straining even if the formed lens unit is maintained at high temperature.

When a liquid material is used as the material of the adhesive layer, the adhesive layer is applied on the substrate and then cured. Examples of such a curing method include ultraviolet curing, thermal curing, curing at normal temperature and pressure bonding.

In the invention, the adhesive layer may be a layer shading at least one of ultraviolet light, visible light and infrared light. Such a means suppresses reflecting in the inside of the lens sections. Further such a means plays a function as diaphragm to make a sensor possible to receive only a desired light ray, and therefore, it resolves a problem such as ghost. The adhesive layer is preferably a layer shading at least one ultraviolet light and visible light, more preferably a layer shading at least visible light. The shading of the light is achieved by addition of black pigment such as carbon black to the adhesive layer. The amount to be added of the carbon black is preferably 0.1 to 1.0% by weight to the weight of the adhesive layer.

In the invention, the adhesive layer comprises a spacer. The spacer in the invention is added into the adhesive layer in order to adjust the distance of the gap sections. FIG. 1 shows an embodiment in which the wafer array lens in the invention are bonded to each other, wherein 1 stands for the wafer lens array, 2 stands for the adhesive layer, 3 stands for the spacer. While the spacer 3 is added into the adhesive layer, generally the spacer 3 is dispersed into the adhesive layer, the wafer lens array are bonded to each other. As a result, the addictive layer having a uniform thickness is achieved. That is, the gap between the wafer lens arrays becomes to have a uniform thickness.

The kind for the spacer is not specifically defined, and preferably is a spherical particle. The spherical particle is suitably defined for its particle size depending on the distance between the wafer lens arrays, and preferably has a particle size of 50 μm or less, more preferably 40 μm or less. The spherical particle as the spacers are required to have uniform particle size due to its object to be used, and preferably have particle size distribution (CV value) of 10% or less. The material of the spacers is not defined and is exemplified by silica. The particle having a spherical shape can preferably shade at least one of ultraviolet light, visible light and infrared light. The particle itself may be composed of material capable of shading at least one of ultraviolet light, visible light and infrared light, or the particle may be a particle in which shading material is applied to the surface thereof.

The spacer for use in the invention preferably has a moisture absorbability of 1% or less, more preferably 0.5% or less. Two of more kinds of the particles having a spherical shape which are different in the particle size or the composition thereof to each other may be used. When two or more kinds of the particles which having different particle size to each other is used, it is favorable that one is used for a transparent particle for adjusting the gap and other is used for a particle capable of shading light and having smaller particle size than that of the transparent particle. Such a selection achieves the adjustment of the gap in addition to the light shading. By using particles having smaller particles, the content of the particles in the adhesive layer rises, and therefore, the adhesive layer is suppressed for thermal expansion.

In the invention, the spacer is preferably dispersed in an amount of 1 to 10% by weight.

In the invention, the wafer lens arrays are bonded only on the surfaces of the substrates. By applying the adhesive layer on the surface of the substrate, the invention makes it possible to stick the wafer lens arrays to each other without influencing the optical properties of the lens.

Forming Method of the Adhesive Layer

A method for forming the adhesive layer on the substrate section is suitably selected from a method by which the adhesive does not protrude to the lenses. Specifically, such a method is exemplified by a patterning method or a method comprising using an adhesive sheet.

The patterning method is exemplified by inkjet-printing or screen-printing. In patterning, the adhesive to be used is generally a liquid type adhesive. When the adhesive to be used is a liquid type, it is preferable to form a layer comprising such an adhesive, taking consideration into the shrinkage of the adhesive. Concretely, it is preferable that a layer comprising an adhesive and having a thickness 10 to 30% thicker than a desired gap thickness to be finally obtained is formed, dried and cured. When the gap having a thickness of 40 μm is desired, a layer having a thickness of about 50 μm before cured may be formed, and then cured. Such a measure can remove air bubble to form an adhesive layer which is excellent in adhesiveness.

When an adhesive sheet is used, the adhesive sheet generally has a shape corresponding to only the shape of the substrate section.

In order to avoid inclusion of air bubble, the adhesive is preferably applied on both surfaces to be bonded of the wafer lens arrays. For the same purpose as the above, the plurality of wafer lens arrays is preferably stuck to each other under vacuum. When the wafer lens arrays are stuck to each other, it is preferable that the stack position of the wafer lens arrays can be determined by marking alignment marks on the wafer lens arrays and confirming with the alignment marks to each other, and then, subjecting it to curing reaction by heat or ultraviolet.

Material of Wafer Lens Array

The wafer lens array for use in the invention is preferably obtained by curing a curable resin composition. The curable resin composition may be a heat-curable resin composition or a resin composition curable by irradiating an active energy ray such as ultraviolet ray or electron ray therewith. The resin composition preferably has a suitable flowability before cured in view of proper transcription of a mold and formability. Concretely, the composition is liquid at ordinary temperature and has a viscosity of about 1000 to 50000 mPa·s. The composition preferably has heat resistance to a degree that the composition after cured does not transform by heat and does not change its color when it is subject to reflow. From the above viewpoints, the cured article preferably has a glass-transition temperature of 200° C. or higher, more preferably 250° C. or higher, further more preferably 300° C. or higher. In order to give such high heat resistance to the resin composition, it is necessary to put restrictions on mobility at the molecular level. The effective measures include (1) increasing crosslink density per unit volume; (2) utilizing a resin having a rigid cyclic structure, which is exemplified by a resin having an alicyclic structure such as cyclohexane, norbornane and tetracyclododecane, an aromatic structure such as benzene and naphthalene, a cardo structure such as 9,9-biphenyl-florene, or a spiro structure such as spiro-biindaene, which are described in JP-A-H9-137043, JP-A-H10-67970, JP-A-2003-55316, JP-A-2007-334018 or JP-A-2007-238883; (3) uniformly dispersing a substance having high glass-transition temperature (Tg) such as inorganic particles, which are described in JP-A-H5-209027 or JP-A-H10-298265. Two or more of the means may not be combined with each other. To the means, an adjustment may be made without impairing other properties for flowability, shrinking ratio and refractive index. The resin composition preferably has a small volume shrinkage ratio based on a curing reaction from the viewpoints of accuracy of transcription of the shape to be formed. The curing shrinkage ratio of the resin composition for use in the invention is preferably 10% or less, more preferably 5% or less, further more preferably 3% or less.

The wafer lens array for use in the invention is generally formed by using a mold. The mold which forms the wafer lens array may be composed of metal or glass. The curing resin composition as the material of the wafer lens array is feed between the molds. The molds are pressed to form a wafer style resin. While the molds are pressed, the curing resin composition was irradiated with ultraviolet ray or heat and cured, to thereby obtaining a substrate section and lens sections. At that time, the cured resin is preferably marked in order to accuracy stacking the plurality of the wafer lens arrays.

The invention further provides a lens module which is obtained by dicing the wafer lens unit to pieces. The method for dicing the wafer lens unit can be a known method and may be a method disclosed in WO2008/084646A1.

The lens module in the invention is preferably applicable to an image pickup unit and the like. The image pickup unit is disclosed in detail in Japanese Patent No. 3926380, WO08/102648, and JP-A-200-97192. The invention discloses an image pickup unit comprising a lens module of the invention, an image device, and a semiconductor substrate on which the image device is provided, wherein the substrate and the semiconductor substrate are integrally bonded through a spacer.

The spacer may be used the technique as mentioned in the above wafer lens array.

The invention discloses a method for manufacturing a wafer lens unit, which bonding two wafer lens arrays having comprising a plurality of lens sections arranged one-dimensionally or two-dimensionally and a substrate section connecting the lens sections through an adhesive layer comprising spacer, and wherein the wafer lens arrays are bonded to each other only on a surface of the substrates. The detail thereof is applicable to the description for the wafer lens unit as mentioned above.

Industrial Applicability

The wafer lens unit in the invention can be easily produced, has high accuracy, and therefore, may be used for various precision instruments.

The present disclosure relates to the subject matter contained in Japanese Patent Application No. 053124/2010 filed on Mar. 10, 2010, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A wafer lens unit comprising a plurality of wafer lens arrays which are stacked,
   wherein the wafer lens array comprises a plurality of lens sections arranged one-dimensionally or two-dimensionally and a substrate section connecting the lens sections to each other,
   wherein the neighboring wafer lens arrays are bonded through an adhesive layer comprising a spacer only at the substrate sections thereof,
   wherein the spacer is a spherical particle, and
   wherein the spacer is dispersed into the adhesive layer in an amount of 1% to 10% by weight.

2. The wafer lens unit according to claim 1, wherein the adhesive layer shades at least one of ultraviolet ray, visible ray and infrared ray.

3. The wafer lens unit according to claim 1, wherein the adhesive layer is formed by patterning.

4. The wafer lens unit according to claim 3, wherein the adhesive layer is formed by inkjet-printing or screen-printing.

5. The wafer lens unit according to claim 1, wherein the adhesive layer is an adhesive sheet having a shape corresponding to the substrate.

6. The wafer lens unit according to claim 1, wherein the material of the wafer lens array and the material constituting the adhesive layer are common to each other by 70% by weight or more.

7. The wafer lens unit according to claim 1, wherein the lens sections are composed of the same composition as the substrate section in at least one of the wafer lens arrays.

8. The wafer lens unit according to claim 1, wherein the spacer is a spherical particle having a particle size of 50 μm or less.

9. The wafer lens unit according to claim 1, wherein the spacer comprises silica.

10. The wafer lens unit according to claim 1, wherein the spacer shades at least one of ultraviolet light, visible light and infrared light.

11. The wafer lens unit according to claim 1, wherein the spacer has a moisture absorbability of 1% or less.

12. The wafer lens unit according to claim 1, wherein the wafer lens arrays is mainly composed of a curable resin having a glass-transition temperature of 200° C. or higher.

13. The wafer lens unit according to claim 1, wherein the difference between the Abbe number of a resin composing the substrate section and the Abbe number of the resin composing the lens sections is 5 or less.

14. The wafer lens unit according to claim 1, which comprises two or three wafer lens arrays.

15. A lens module obtained by dicing the wafer lens unit according to claim 1 into pieces.

16. An image pickup unit comprising the lens module according to claim 15, a semiconductor substrate and an image pickup device provided on the semiconductor substrate, wherein the substrate and the semiconductor substrate are bonded through a spacer.

17. A method for manufacturing a wafer lens unit,
   which comprises bonding two wafer lens arrays to each other through an adhesive layer comprising a spacer,
   wherein the wafer lens array comprises a plurality of lens sections arranged one-dimensionally or two-dimensionally and a substrate section connecting the lens sections to each other,
   wherein the spacer is a spherical particle, and
   wherein the spacer is dispersed into the adhesive layer in an amount of 1% to 10% by weight.

18. The method for manufacturing a wafer lens unit according to claim 17, wherein the wafer lens arrays are bonded to each other under vacuum.

19. A method for manufacturing a wafer lens unit, comprising:
   providing a first lens array having a first plurality of lens sections and a first plurality of substrate sections, each lens section of the first plurality of lens sections being connected to each of the adjacent lens sections of the first plurality of lens sections by one of the substrate sections of the first plurality of substrate sections;

providing a second lens array having a second plurality of lens sections and a second plurality of substrate sections, each lens section of the second plurality of lens sections being connected to each of the adjacent lens sections of the second plurality of lens sections by one of the substrate sections of the second plurality of substrate sections;

dispersing spherical spacers within an adhesive in an amount of 1% to 10% by weight;

after dispersing the spherical spacers within the adhesive, applying the adhesive exclusively between the first plurality of substrate sections of the first lens array and the second plurality of substrate sections of the second lens array and not between the first plurality of lens sections of the first lens array and the second plurality of lens sections of the second lens array.

20. The method for manufacturing a wafer lens unit according to claim 19, wherein applying the adhesive includes applying between the first plurality of substrate sections and the second plurality of substrate sections at a thickness 10% to 30% thicker than a predetermined lens unit operational thickness, and wherein further comprising, after applying the adhesive, curing the adhesive.

\* \* \* \* \*